(12) United States Patent
Miyano et al.

(10) Patent No.: US 7,381,275 B2
(45) Date of Patent: Jun. 3, 2008

(54) APPARATUS AND METHOD FOR MANUFACTURING SEMICONDUCTOR

(75) Inventors: Junichi Miyano, Miyazaki (JP);
Kiyohiko Toshikawa, Miyazaki (JP);
Yoshikazu Motoyama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 1145 days.

(21) Appl. No.: 10/273,147

(22) Filed: Oct. 18, 2002

(65) Prior Publication Data
US 2003/0075107 A1 Apr. 24, 2003

(30) Foreign Application Priority Data
Oct. 24, 2001 (JP) ............................. 2001/325769

(51) Int. Cl.
*C23C 16/48* (2006.01)
*C23F 1/00* (2006.01)
*H01L 21/306* (2006.01)
*C23C 16/44* (2006.01)

(52) U.S. Cl. .................. 118/724; 118/641; 156/345.37

(58) Field of Classification Search ................ 118/715, 118/728, 50; 156/345.55, 345.29, 345.33–36
See application file for complete search history.

(56) References Cited

U.S. PATENT DOCUMENTS

| 4,933,042 | A | * | 6/1990 | Eichelberger et al. ...... 156/239 |
| 5,252,132 | A | * | 10/1993 | Oda et al. .................... 118/725 |
| 5,316,579 | A | * | 5/1994 | McMillan et al. ............ 118/50 |
| 5,551,982 | A | * | 9/1996 | Anderson et al. ........... 118/715 |
| 5,593,608 | A | * | 1/1997 | Suzuki ....................... 219/492 |
| 6,284,050 | B1 | * | 9/2001 | Shi et al. .................... 118/715 |

* cited by examiner

*Primary Examiner*—Rudy Zervigon
(74) *Attorney, Agent, or Firm*—Rabin & Berdo, PC

(57) ABSTRACT

The present invention provides a semiconductor manufacturing apparatus which stabilizes the quality of thickness of a film between solids, which is produced on a wafer in the semiconductor manufacturing apparatus by a CVD method using light, and improves in-plane thickness uniformity to thereby bring about excellent production efficiency. The semiconductor manufacturing apparatus is provided with a gas supply pipe for supplying a material gas to a chamber used to store the wafer placed in the semiconductor manufacturing apparatus, and a transparent plate which is provided in the chamber and allows the light to pass therethrough. The transparent plate is heated by a heater to thereby prevent the production of the film on the transparent plate and control the concentration of a material gas in the vicinity of an object to be processed.

15 Claims, 7 Drawing Sheets

APPARATUS AND METHOD FOR MANUFACTURING SEMICONDUCTOR

BACKGROUND OF THE INVENTION

1. Field of the Invention

The present invention relates to an apparatus and a method for manufacturing a semiconductor by a chemical vapor deposition method using light.

2. Description of the Related Art

As a conventional example of this type of semiconductor manufacturing apparatus, there is known one illustrated in an explanatory view of FIG. 13 by way of example.

In the drawing, reference numeral 1 indicates a chamber used for the semiconductor manufacturing apparatus.

Reference numeral 2 indicates a transparent plate, which is made up of a transparent material such as quartz glass or synthetic quartz glass and allows light to pass therethrough.

Reference numerals 3 indicate light sources, which are stored in a lamp house 4 and emit light such as vacuum ultraviolet light, ultraviolet light necessary for chemical vapor deposition (hereinafter called "CVD") using light.

Reference numeral 5 indicates a top or a top plate which is provided over the chamber 1 and to which the transparent plate 2 is attached.

Reference numeral 6 indicates a gas supply pipe which supplies a material gas composed of gas used as a film producing material such as tetraethoxyorthosilicate (Si (OC$_2$H$_5$)$_4$ (hereinafter called TEOS), tetramethylorthosilicate (Si(OCH$_3$)$_4$) or the like, or additive gas such as oxygen to within the chamber 1.

Incidentally, the material gas varies according to the type of a film to be produced and might not contain the additive gas.

Reference numeral 7 indicates a wafer used as an object to be processed, which is formed of a material such as silicon, or germanium. The material for the wafer 7 may also be silicon carbide, gallium arsenide or the like in addition to the above. However, the material is not limited to the above examples if other materials available as semiconductor materials are used.

Reference numeral 8 indicates a stage which is attached to a post 9 and stored within the chamber 1. Further, the stage 8 has the wafer 7 placed thereon and fixed thereto to perform its positioning.

Reference numeral 10 indicates a cooling system which is connected to a cooling pipe 11 for cooling the stage 8. A coolant such as water or ethylene glycol introduced into the cooling pipe 11 circulates in the stage 8.

Reference numeral 12 indicates an exhaust chamber, which is connected to an unillustrated vacuum pump and adjusts the degree of vacuum in the chamber 1 by controlling the degree of opening of a valve 13 provided within the exhaust chamber 12.

When silicon (Si) is used as the wafer 7 and an oxide film is produced by a CVD method using vacuum ultraviolet light under the above configuration, the light source 3 is used as a xenon (Xe$_2$) excimer lamp and applies vacuum ultraviolet light therefrom. A material gas composed of TEOS and oxygen (O$_2$) used as the additive gas is supplied to within the chamber 1 through the gas supply pipe 6 at a predetermined flow rate and sucked by the unillustrated vacuum pump through the exhaust chamber 12. The valve 13 is then adjusted to keep the pressure in the chamber 1 at a predetermined degree of vacuum.

Since, at this time, the temperature of the wafer 7 rises due to radiant heat of the light source 3, reaction heat of the material gas, or the like, the wafer 7 is cooled by the coolant introduced from the cooling system 10 through the cooling pipe 11 so as to be always kept at a suitable temperature, e.g., 25° C.

The above state is kept for a predetermined production time. Consequently, TEOS is decomposed at room temperature so that an oxide film such as a silicon dioxide (SiO$_2$) film is grown on the wafer 7.

In the above-described related art, however, the film is formed not only on the wafer 7 but also on the transparent plate 2. Thus, fogging occurs in the transparent plate 2, so that the transmission of the vacuum ultraviolet light is inhibited.

Therefore, a problem arises in that the rate of production of the film on the wafer 7 is degraded and the thickness of the film varies between respective deposition operations, thereby destabilizing the quality of the film thickness between individuals.

Also a problem arises in that the stabilization of the quality of the film thickness needs to increase the frequency of replacement of the transparent plate 2 with another, and production lines must be stopped frequently for its replacement, thereby degrading production efficiency.

Further, since a step is formed between the transparent plate 2 for allowing the vacuum ultraviolet light to pass therethrough and the top plate 5 of the chamber 1 and shaped in a downwardly-extending convex form, the distribution of concentration of the material gas between the transparent plate 2 and the wafer 7 becomes ununiform.

As a result, a problem arises in that the film produced on the wafer 7 results in a distribution state in which the center thereof is thick and its peripheral portion is thin, thus impairing in-plane thickness uniformity. Further, a problem arises in that a product yield of each semiconductor fabricated from one wafer 7 is degraded so that production efficiency is decreased. This phenomenon noticeably appears as the distance between the transparent plate 2 and the wafer 7 approaches or decreases.

SUMMARY OF THE INVENTION

Thus, the present invention aims to realize an apparatus for manufacturing a semiconductor by a CVD method using light, which stabilizes the quality of the thickness of a film between solids and improves in-plane thickness uniformity to thereby provide excellent production efficiency.

In order to solve the above problems, the present invention provides an apparatus for manufacturing a semiconductor by a CVD method using light, which comprises a chamber for storing a wafer used as an object to be processed therein, a gas supply pipe for supplying a material gas to the chamber, a transparent plate provided within the chamber, for allowing the light to pass therethrough, and a heater for heating the transparent plate, which is attached to the apparatus, whereby the production of a film on the transparent plate is prevented, and the concentration of the material gas in the vicinity of the object to be processed is controlled.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of semiconductor manufacturing apparatuses according to the present invention will hereinafter be described with reference to the accompanying drawings.

First Embodiment

Figure 1:
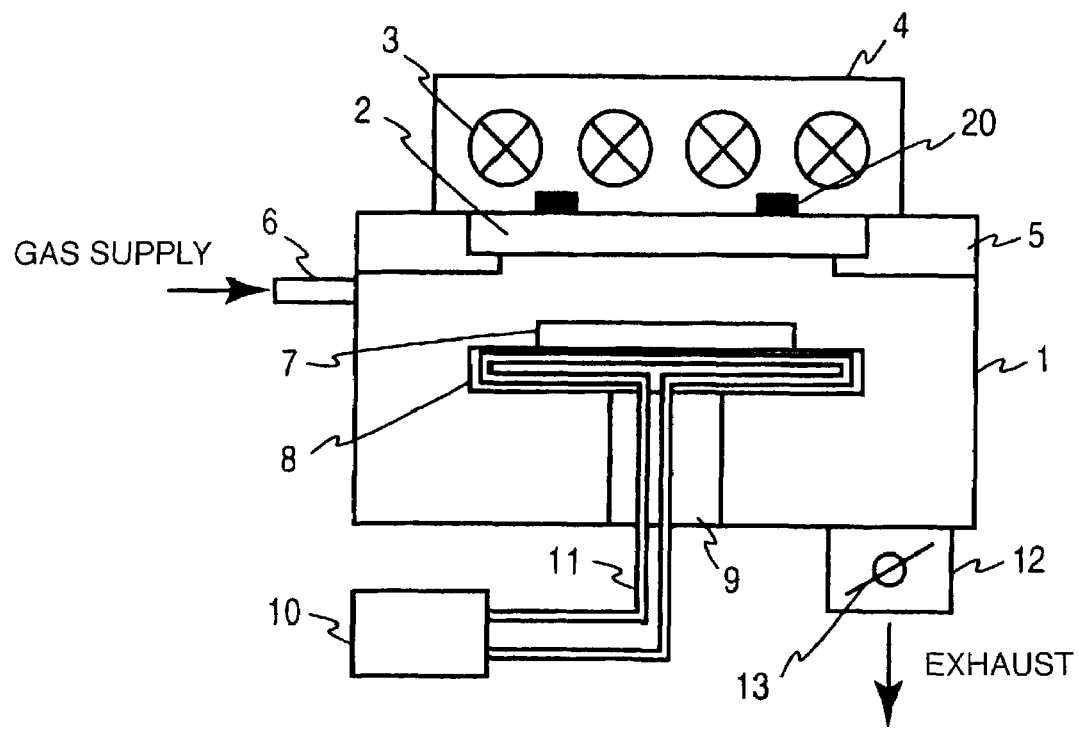
FIG. 1 is an explanatory view showing a first embodiment of the present invention.
Figure 2:
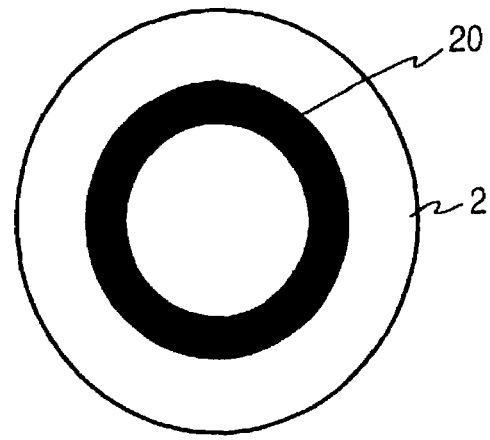
FIG. 2 is an explanatory view illustrating the state of placement of a heater employed in the first embodiment of the present invention.

FIG. 1 is an explanatory view showing a first embodiment of the present invention, and FIG. 2 is an explanatory view illustrating the state of installation of a heater, respectively.

Incidentally, components similar to those employed in the conventional example are respectively identified by the same reference numerals and the description thereof will therefore be omitted.

Reference numeral 20 indicates a heater, which is adjacent to a transparent plate 2 and provided outside a chamber 1. As shown in FIG. 2, the heater 20 is shaped in a ring form and disposed on the transparent plate 2 and in the neighborhood of its peripheral portion.

Incidentally, the chamber 1 and a top or top plate 5 may be integrally formed by means such as press molding, welding or the like.

The shape of the heater 20 may take any shape like ellipsoid, quadrangle, etc. The shape of the heater 20 is not limited to the ring form if the placement of such an annular shape as to encircle space in the vicinity of a central portion of the transparent plate 2 as shown in FIG. 2, is taken.

The operation of the above-described configuration will next be explained.

When an oxide film is formed on a wafer 7 by a CVD method through the use of vacuum ultraviolet light, the periphery of the transparent plate 2 is heated by the heater 20 to raise the temperature of the periphery of the transparent plate 2. Consequently, the transparent plate 2 takes a temperature distribution low in the center thereof and high in its periphery.

Since, at this time, radiant heat is applied from the transparent plate 2 to the wafer 7, and the wafer 7 rises in temperature as compared with the conventional example. However, for example, the capability of a cooling system 10 is enhanced to keep the wafer 7 at a suitable temperature.

In the above state, a material gas is supplied from a gas supply pipe 6 to properly keep the degree of vacuum within the chamber 1, and the vacuum ultraviolet light is applied from each of light sources 3 for a predetermined production or generation time to thereby form or produce a film on the wafer 7.

At this time, convection is produced in a concave portion formed between the transparent plate 2 that allows the vacuum ultraviolet light to pass therethrough and the top plate 5 of the chamber 1.

While the temperature of the transparent plate 2 has risen due to radiant heat of each of the light sources 3 and the heat of reaction of the material gas, etc. in the conventional example, the heat of the transparent plate 2 is lost by the conduction of heat from the transparent plate 2 to the peripheral top plate 5, so that the peripheral portion thereof is decreased in temperature and the central vicinity thereof is increased in temperature. Further, the material gas is apt to collect in the vicinity of the center of the transparent plate 2 by convection, and the material gas in the neighborhood of the center thereof has increased in concentration.

According to the present invention on the other hand, the peripheral portion of the transparent plate 2 is heated by the heater 20, thereby making it possible to prevent the outflow of heat due to the conduction of heat to the top plate 5 and keep the temperature of the central vicinity of the transparent plate 2 low as compared with its peripheral portion while the temperature of the transparent plate 2 is being held relatively high.

It is thus possible to suppress convection developed in the concave portion lying between the transparent plate 2 and the top plate 5 and keep uniformity of a material-gas concentration distribution on a deposition surface of the wafer 7.

Since the action of deposition or growth by the CVD method using the vacuum ultraviolet light in a film-producing process has the property of being easy to grow the film on a deposition surface low in temperature and hard to deposit (grow) it on a deposition surface high in temperature, the deposition action effected on the transparent plate 2 held at a relatively high temperature by the heater 20 is suppressed.

Incidentally, when more accurate temperature management is required to control or suppress the temperature of the transparent plate and the convection developed in the concave portion, this can be achieved by providing multiple heaters such a double heater, a triple heater, etc. and controlling these independently.

To this end, the heater 20 may be placed adjacent to the side of the transparent plate 2. Alternatively, a thin film-shaped heater like a ribbon heater may be placed inside the chamber 1.

In this case, it is not necessary to concentrically place the multiple heater, the heater provided on the side of the transparent plate or the heater provided inside the chamber.

It is necessary to control the placement and temperatures of the respective heaters so that, for example, their shapes and combination are changed to obtain a target temperature distribution.

By doing so, in-plane film uniformity can further be enhanced and the productivity of semiconductors can be improved.

Second Embodiment

Figure 3:
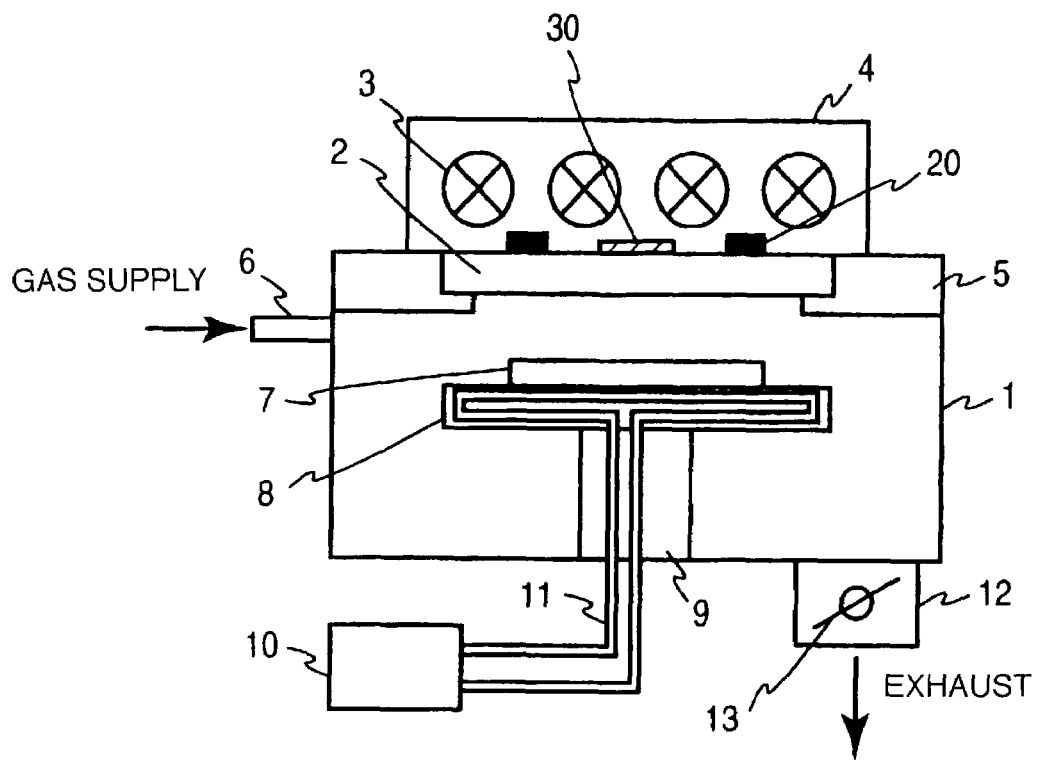
FIG. 3 is an explanatory view depicting a second embodiment of the present invention.
Figure 4:
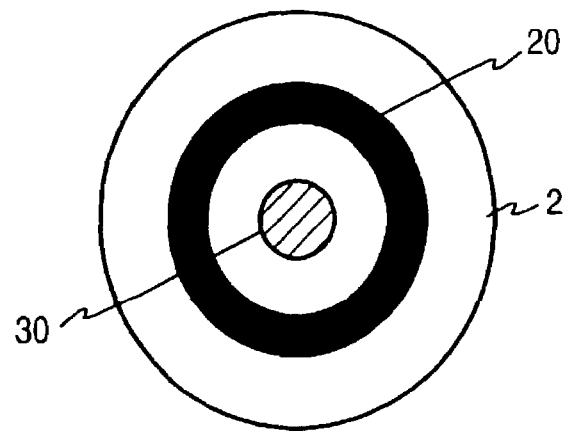
FIG. 4 is an explanatory view showing the state of placement of a mask member employed in the second embodiment of the present invention.
Figure 5:
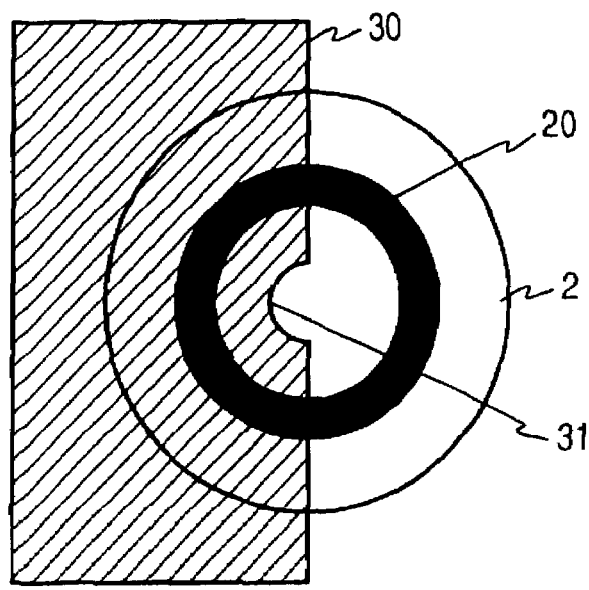
FIG. 5 is an explanatory view illustrating another form of the mask member employed in the second embodiment of the present invention.

FIG. 3 is an explanatory view showing a second embodiment of the present invention, FIG. 4 is an explanatory view illustrating the state of installation of a mask member, and FIG. 5 is an explanatory view showing another form of the mask member, respectively.

Incidentally, components similar to those employed in the conventional example and the first embodiment are respectively identified by the same reference numerals and the description thereof will therefore be omitted.

Reference numeral 30 indicates a mask member for blocking light emitted from each of light sources 3. It is made up of a metal plate such as aluminum, or a transparent or semitransparent material such as quartz glass, synthetic quartz glass, or the like.

The operation of the above configuration will be explained.

Incidentally, since the operation of preventing a transparent plate 2 from fogging and the operation of producing a film on a wafer 7 are similar to the above, the description thereof will be omitted.

When in-plane thickness uniformity is lacking, particularly when a portion locally thick in thickness is formed even in the case of the result that the first embodiment has made it possible to suppress the convection developed in the concave portion between the transparent plate 2 and the top plate 5 and keep the uniformity of the concentration distribution of the material gas, the mask member 30 formed using the metal plate is placed on an optical path of light that reaches the portion to reduce the amount of the light transmitted therethrough and lower the speed or rate of producing the film on the wafer 7, thereby adjusting the amount of the film produced within a predetermined production time.

When the rate of decrease in the transmitted amount of light increases depending on the mask member 30, a mask member 30 formed using a transparent or semitransparent material such as synthetic quartz glass is placed on the optical path of light and the transmitted path of light is lengthened to control the transmitted amount of light. In this case, it is necessary to take into consideration a refraction phenomenon of the light or positively utilize it to determine the placement of the mask member 30.

Further, when a thickness distribution takes such a distribution form that the film becomes thick on the gas supply pipe 6 side and becomes thin on the side opposite thereto, a plate-shaped mask member 30 shown in FIG. 5 is used to control the transmitted amount of light on the upstream side of a material gas to be supplied. In this case, a cut-away or notch portion 31 shown in the drawing is provided as necessary to thereby control the transmitted amount of light so that a thickness distribution is rendered uniform.

According to the above, the mask member 30 is used to control the transmitted amount of light in addition to the effect of increasing the temperature of the transparent plate 2 by means of the heater 20, whereby the rate of producing the film on the wafer 7 can be controlled and the production of the film at the portion thick in thickness can be suppressed. It is therefore possible to further enhance the thickness uniformity within the deposition surface of the wafer 7 and further improve the productivity of each semiconductor.

Incidentally, while the mask member 30 has been illustrated as the plate having the circular plate or the semicircular notch portion 31, it is necessary to fabricate the mask member 30 with the shape of the mask member 30 being matched with the shape of the portion that needs to suppress or control the production of the film thickness. Further, the shape of the mask member 30 is not limited to the above. When the transparent or semitransparent material is used therefor, the thickness and size thereof are changed to thereby allow control to the optimum transmitted amount of light.

Third Embodiment

Figure 6:
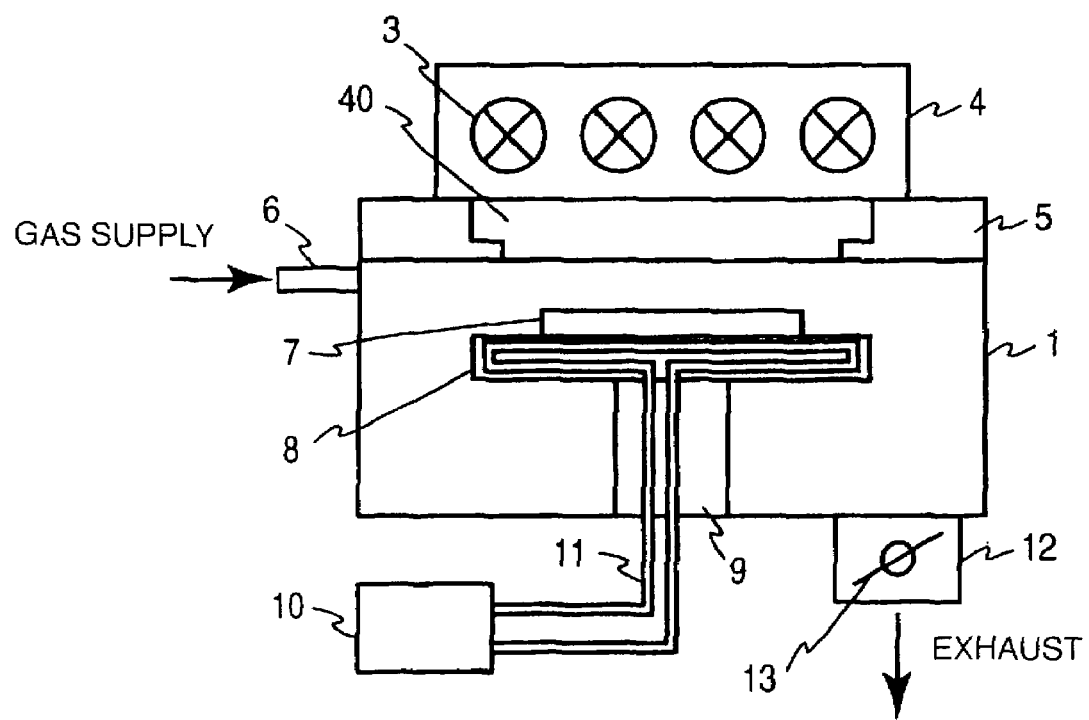
FIG. 6 is an explanatory view depicting a third embodiment of the present invention.

FIG. 6 is an explanatory view showing a third embodiment of the present invention.

Incidentally, components similar to those employed in the conventional example and the first embodiment are respectively identified by the same reference numerals and the description thereof will therefore be omitted.

Reference numeral 40 indicates a transparent plate, which is shaped in a convex form as shown in FIG. 6.

The operation of above-described configuration will be explained.

Incidentally, since the operation of preventing a transparent plate 40 from fogging and the operation of producing a film on a wafer 7 are similar to the above, the description thereof will be omitted.

A surface of the concave-shaped transparent plate 40, which extends to the inside of a chamber 1, is formed as a convex portion and mounted so as to take substantially the same surface as a top plate 5, i.e., substantially flush with the internal surface of the chamber 1.

Consequently, the concave-shaped portion formed in the first embodiment is resolved, the convection-generated portion can be eliminated and the uniformity of a material gas between the wafer 7 and the transparent plate 40 is further improved in addition to the effect of increasing the temperature of the transparent plate 2 by use of the heater 20. It is therefore possible to further enhance in-plane thickness-uniformity and further enhance the productivity of each semiconductor.

Incidentally, while the present embodiment has described the case in which the transparent plate 40 is shaped in the convex form, the shape of the transparent plate 40 is shaped in the form of a truncated cone and a surface thereof small in area may be formed so as to be fixed as a surface thereof extending to the inside of the chamber 1 and take substantially the same surface of the top plate 5.

Fourth Embodiment

Figure 7:
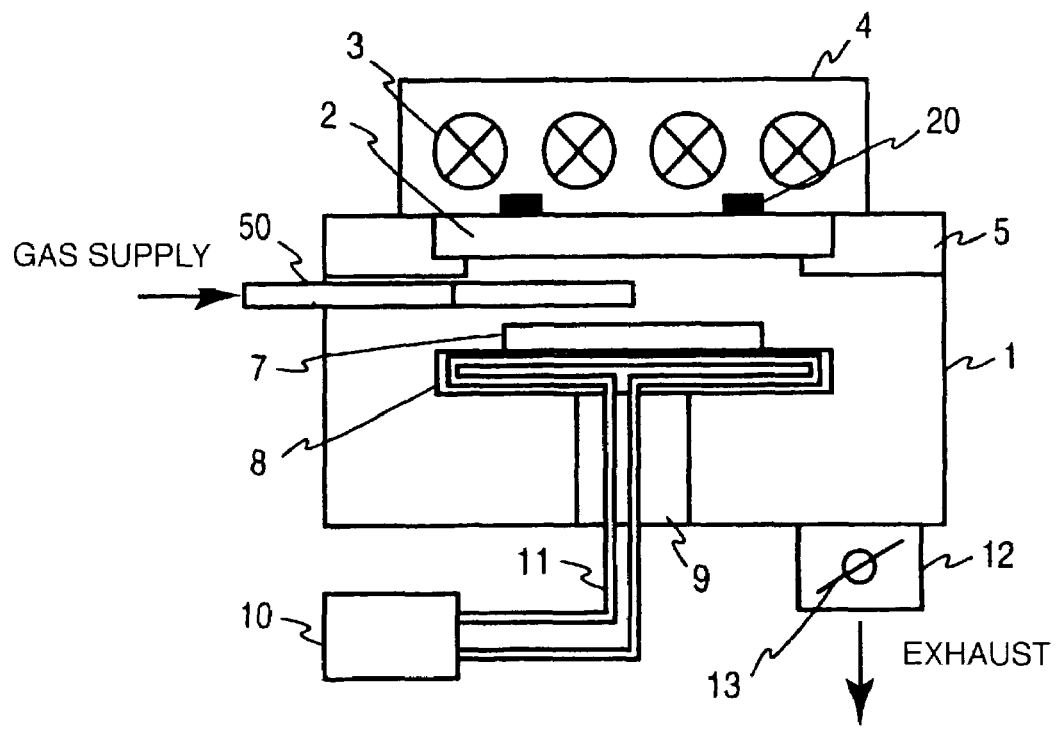
FIG. 7 is an explanatory view showing a fourth embodiment of the present invention.
Figure 8:
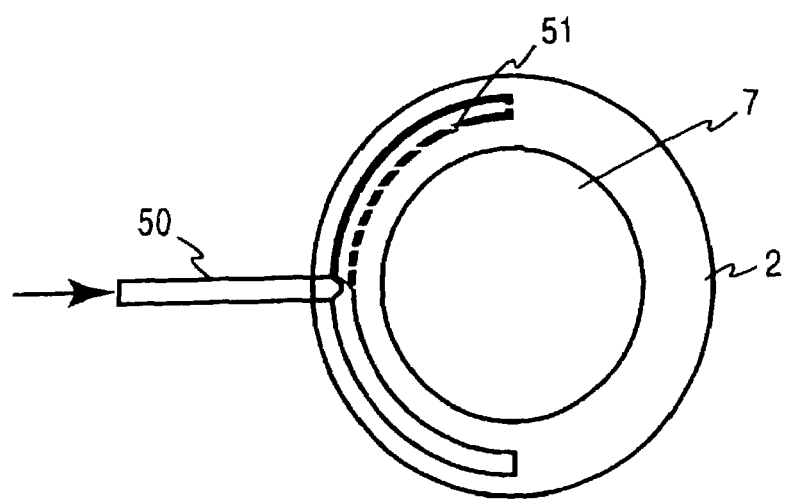
FIG. 8 is an explanatory view illustrating the state of placement of a gas supply pipe employed in the fourth embodiment of the present invention.

FIG. 7 is an explanatory view showing a fourth embodiment of the present invention, and FIG. 8 is an explanatory view illustrating the state of placement of a gas supply pipe, respectively.

Incidentally, components similar to those employed in the conventional example and the first embodiment are respectively identified by the same reference numerals and the description thereof will therefore be omitted.

Reference numeral 50 indicates a gas supply pipe.

As shown in FIG. 8, the gas supply pipe 50 is provided with pipe members each shaped in a substantially arcuate form, which extend from its inlet to both sides thereof in the direction to face the wafer 7. A plurality of gas supply ports or holes 51 are provided on the wafer 7 side in such a manner that a material gas is supplied to a substantially whole area of a deposition surface of the wafer 7.

Incidentally, the gas supply pipe 50 is provided with pipe members having shapes provided so as to take a substantially Y-shape or T-shape. It may be provided so as to have a function similar to the above.

The operation of the above-described configuration will be explained.

Incidentally, since the operation of preventing a transparent plate 2 from fogging and the operation of producing a film on the wafer 7 are similar to the above, the description thereof will be omitted.

When the gas supply pipe 50 is supplied with the material gas, the supplied gas is discharged into a chamber 1 through the gas supply ports 51 provided in plural form.

Since, at this time, the gas supply ports 51 are disposed so as to surround the wafer 7 over its approximately halfway, the material gas supplied via the gas supply ports 51 is substantially uniformly supplied onto the deposition surface of the wafer 7, so that the uniformity of the concentration of the material gas in the vicinity of the deposition surface of the wafer 7 is further improved.

Thus, an advantageous effect is obtained in addition to the effect of increasing the temperature of the transparent plate 2 by means of the heater 20 in that a concentration distribution of the material gas is improved and consequently the efficiency of reaction is improved in addition to the achievement of excellent inplane thickness uniformity.

As a result, a film production time can also be shortened and the efficiency of production of each semiconductor can be further improved.

Fifth Embodiment

Figure 9:
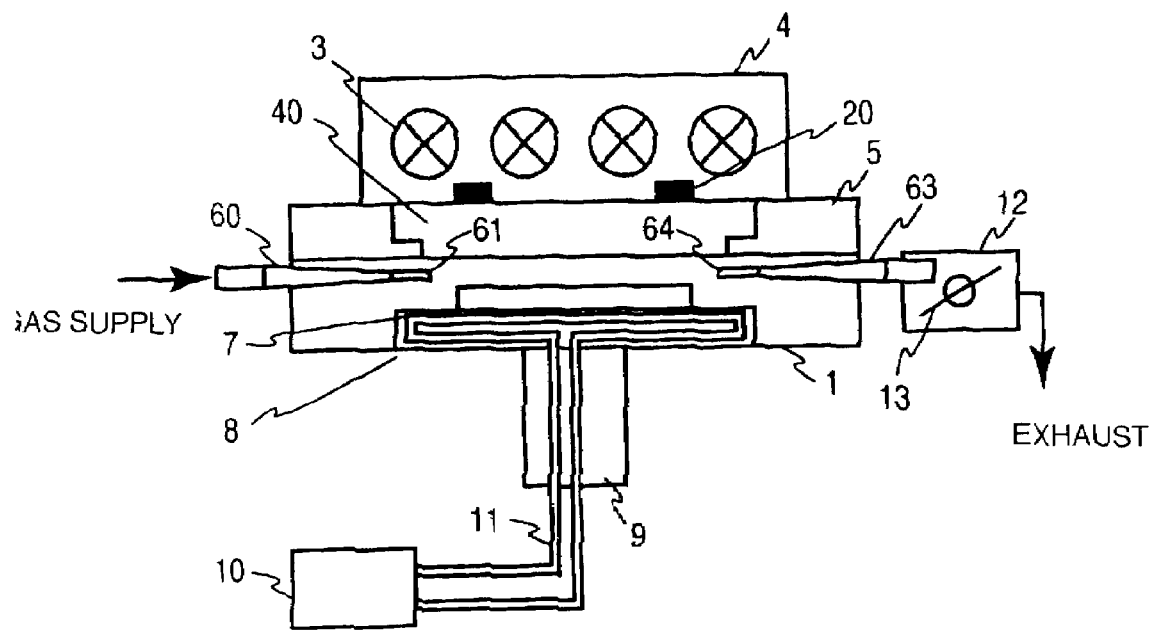
FIG. 9 is an explanatory view showing a fifth embodiment of the present invention.
Figure 10:
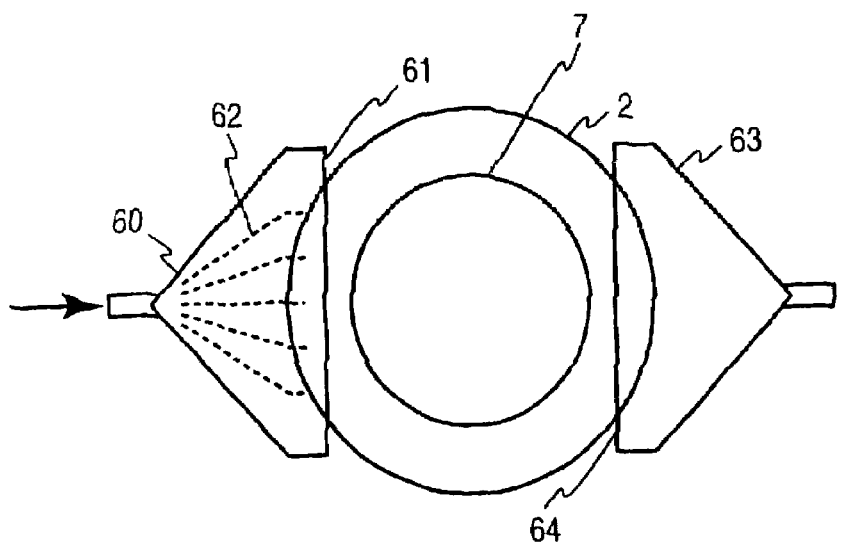
FIG. 10 is an explanatory view illustrating the state of placement of a gas supply pipe employed in the fifth embodiment of the present invention.

FIG. 9 is an explanatory view showing a fifth embodiment of the present invention, and FIG. 10 is an explanatory view showing the state of placement of a gas supply pipe, respectively.

Incidentally, components similar to those employed in the conventional example and the first embodiment are respectively identified by the same reference numerals and the description thereof will therefore be omitted.

Reference numeral 60 indicates a gas supply pipe which has a tip or leading end shaped in the form of a substantially triangle as shown in FIG. 10 and is provided with a slit-shaped gas supply port 61 which is wider than the diameter of a wafer 7 at its ends and open within a chamber 1.

Guide plates 62 are provided within the gas supply pipe 60 and serve so as to uniformize a distribution of a material gas discharged through the gas supply port 61.

A convex transparent plate 40 similar to one illustrated in the third embodiment is placed in the chamber 1. The transparent plate 40 and the wafer 7 are placed so as to oppose each other with a distance slightly larger than a slit width (slit width extending in the direction orthogonal to the sheet in FIG. 10) of the gas supply port 61. The internal volume of the chamber 1 is provided so as to decrease as compared with the chambers employed in the respective embodiments, particularly to decrease in a vertical direction thereof.

An exhaust chamber 12 is provided so as to communicate with an exhaust pipe 63 provided at a surface of the chamber 1, which is opposite to a mounting surface of the gas supply pipe 60. An exhaust/intake port 64 is shaped in the form of a slit having a shape and a size substantially similar to the gas supply port 61 of the gas supply pipe 60.

The operation of the above-described configuration will next be described.

Incidentally, since the operation of preventing a transparent plate 2 from fogging and the operation of producing a film on the wafer 7 are similar to the above, the description thereof will be omitted.

If the gas supply pipe 60 employed in the present embodiment is applied as an alternative to the arcuate gas supply pipe 50 employed in the fourth embodiment, a similar advantageous effect is obtained owing to the operation similar to the fourth embodiment.

According to the present embodiment, the exhaust/intake port 64 is placed in the position opposite to the gas supply port 61, and the distance between the transparent plate 40 and the wafer 7 is shortened. Thus, the uniformity of the flow of the material gas on the deposition surface of the wafer 7 can be enhanced. Owing to the flowing or supply of the material gas in a layer form, the uniformity of the concentration of the material gas on the deposition surface of the wafer 7 can further be improved.

Consequently, further improvements in in-plane thickness uniformity and the production rate of the film can be achieved in addition to the above advantageous effect and hence the efficiency of production of each semiconductor can be further enhanced.

Sixth Embodiment

Figure 11:
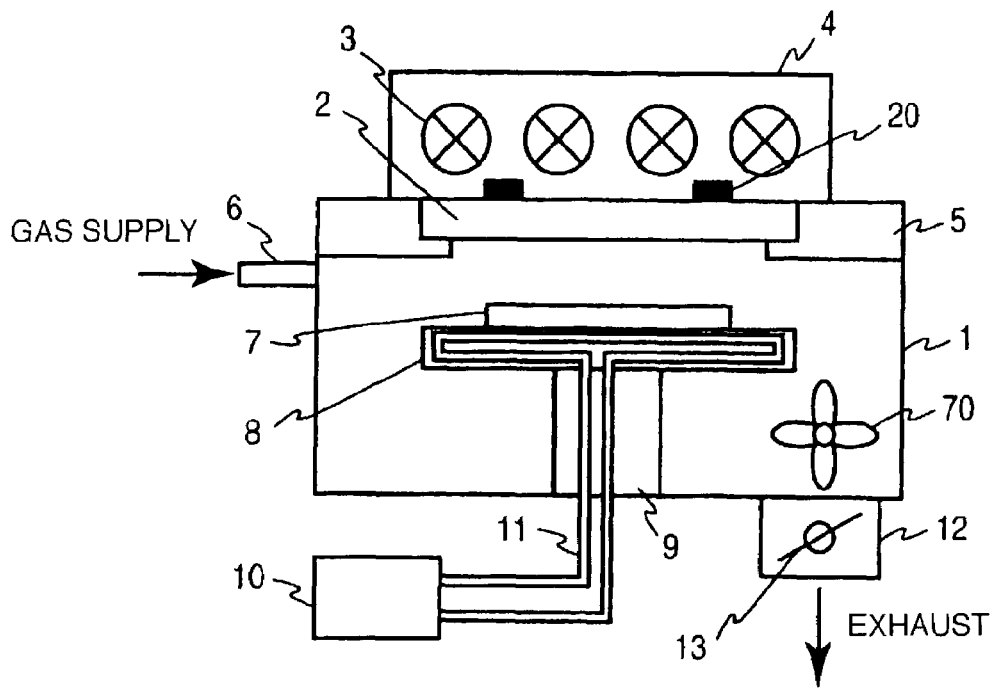
FIG. 11 is an explanatory view depicting a sixth embodiment of the present invention.

FIG. 11 is an explanatory view showing a sixth embodiment of the present invention.

Incidentally, components similar to those employed in the conventional example and the first embodiment are respectively identified by the same reference numerals and the description thereof will therefore be omitted.

Reference numeral 70 indicates a stirring fan, which is installed within a chamber 1.

The operation of the above-described configuration will be explained.

Incidentally, since the operation of preventing a transparent plate 2 from fogging and the operation of producing a film on a wafer 7 are similar to the above, the description thereof will be omitted.

The wafer 7 is cooled by a cooling system 10. A material gas is sucked by an unillustrated vacuum pump through an exhaust chamber 12 while being supplied to the chamber 1 through a gas supply pipe 6, so that the chamber 1 is held thereinside at a predetermined degree of vacuum. At this time, the fan 70 is driven to stir the material gas within the chamber, and vacuum ultraviolet light is applied from each of lights 3.

Thus, the chamber 1 is stirred thereinside to thereby uniform the concentration of the material gas within the chamber 1 in addition to the effect of increasing the temperature of the transparent plate 2 by means of a heater 20, whereby the uniformity of the concentration of the material gas in the neighborhood of the wafer 7 is enhanced. It is therefore possible to achieve an improvement in in-plane thickness uniformity and an improvement in the efficiency of production of each semiconductor.

Seventh Embodiment

Figure 12:
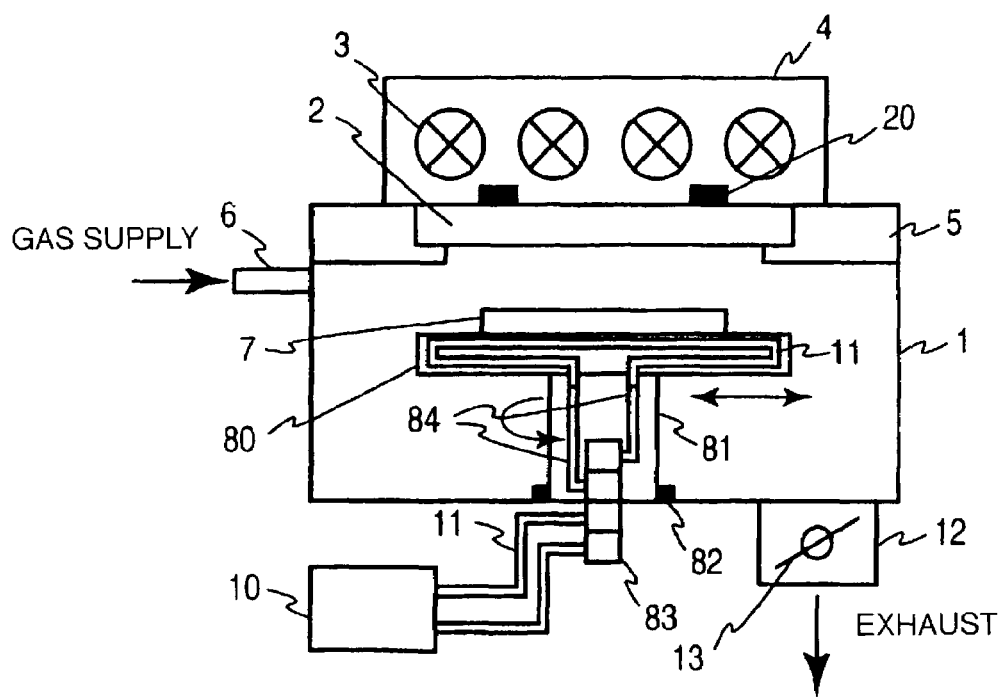
FIG. 12 is an explanatory view showing a seventh embodiment of the present invention.
Figure 13:
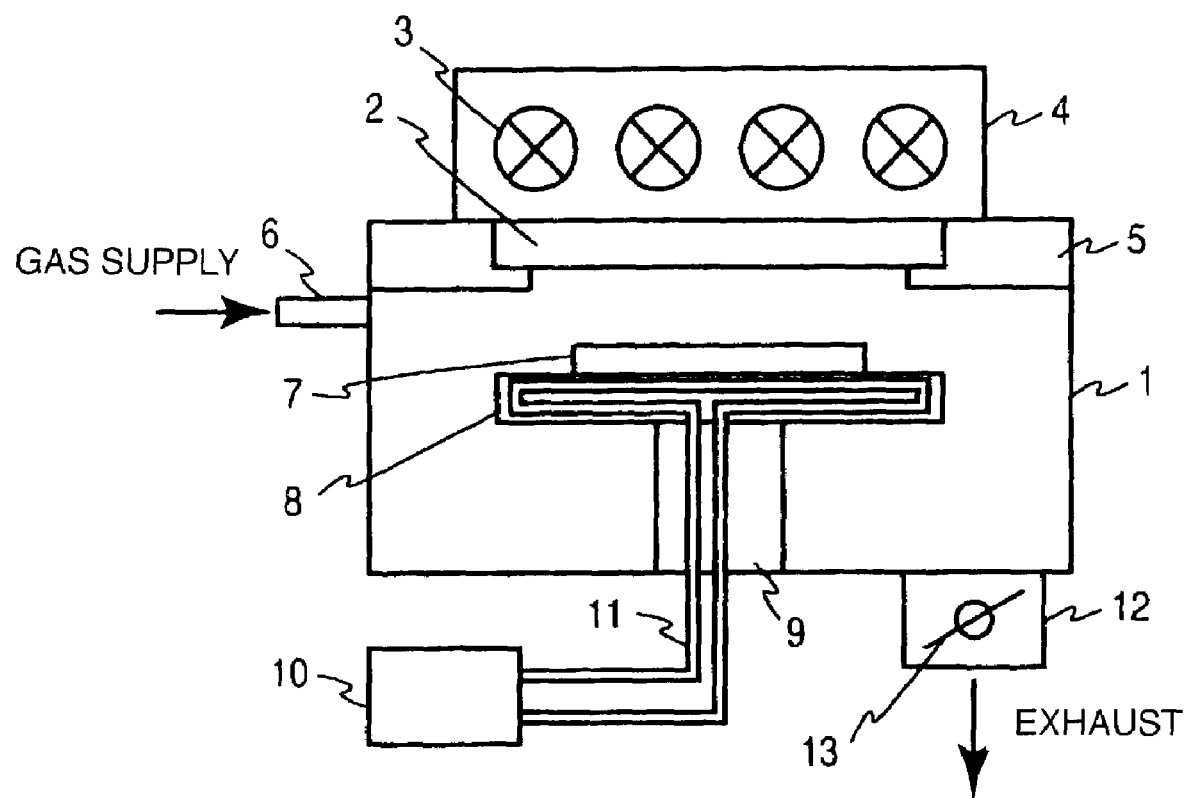
FIG. 13 is an explanatory view illustrating a conventional example.

FIG. 12 is an explanatory view showing a seventh embodiment of the present invention.

Incidentally, components similar to those employed in the conventional example and the first embodiment are respectively identified by the same reference numerals and the description thereof will therefore be omitted.

Reference numeral 80 indicates a stage, which is attached to a post 81.

The stage 80 is installed so as to be capable of performing rotational motion or back-and-forth and right-and-left reciprocating motion by driving the post 81 by means of an unillustrated drive source.

Incidentally, a seal member 82 such as a mechanical seal, a lip seal or the like is placed on a post attachment surface of a chamber 1 so that the degree of vacuum in the chamber 1 can be held while the post 81 is being driven.

A seal device 83 such as a mechanical seal is provided on a path of a cooling pipe 11 so as to avoid leakage of a coolant while the stage 80 is being under the rotational motion. In order to relax a bending stress developed in the cooling pipe 11 while the stage 80 is being under the reciprocating motion, the cooling pipe 11 and the seal device 83 are brought into engagement by pipes 84 using rubber or an elastic body such as silicon tube.

The operation of the above-described configuration will be explained.

Incidentally, since the operation of preventing a transparent plate 2 from fogging and the operation of producing a film on a wafer 7 are similar to the above, the description thereof will be omitted.

The wafer 7 is cooled by a cooling system 10. A material gas is sucked by an unillustrated vacuum pump through an exhaust chamber 12 while being supplied to the chamber 1 through a gas supply pipe 6, whereby the chamber 1 is held thereinside at a predetermined degree of vacuum. Further, vacuum ultraviolet light is applied to the chamber 1 from each of light sources 3. At this time, the stage 80 is rotatably moved and moved forward and backward, for example.

Thus, the thickness of a film produced on the wafer 7 is uniformized in its circumferential direction or in its back-and-forth and right-and-left directions. In this case, when the film is ununiform in thickness as viewed in the circumferential direction thereof in a state in which the stage 80 is deactivated, the stage 80 is placed under rotational motion. When the film is ununiform in thickness as viewed in a radial direction thereof, the stage 80 is moved back and forth in the direction to correct its ununiformity. Consequently, in-plane thickness uniformity can further be improved.

According to the above, even when the uniformity of a concentration distribution of the material gas is insufficient, the in-plane thickness uniformity can be improved under the motion of the wafer 7 by the stage 80 in addition to the effect of raising the temperature of the transparent plate 2 by means of a heater 20. Further, the efficiency of production of each semiconductor can be enhanced.

Incidentally, the respective embodiments can provide further improvements in effect by utilizing some of them in combination. Thus, an apparatus for manufacturing each semiconductor by a CVD method using light can be realized which has high production efficiency.

Small-sized manufacturing facilities can bring about advantageous effects in that the above-described embodiments are singly applied to thereby improve defects of their facilities and enhance production efficiency corresponding to the scales thereof, thereby making it possible to realize a manufacturing apparatus or a manufacturing method high in investment efficiency.

While the present invention has described, as an example, the semiconductor manufacturing apparatus for producing the oxide film on the wafer by the CVD method using the vacuum ultraviolet light, it is also easy to apply the invention to a semiconductor manufacturing apparatus based on a CVD method using another light, e.g., ultraviolet light. Further, the present invention is applicable to a semiconductor manufacturing apparatus based on a CVD method using all lights.

Further, the present invention can be applied even to a semiconductor manufacturing apparatus which provides production of, for example, an insulating film or coating in general, a ferroelectric film, a metal wiring film, etc., other than the production of the oxide film.

In this case, the heating temperature, position and form of a heater, the material, position and shape of a mask member, and the type of gas supply pipe, etc. are suitably changed according to the size of a chamber and the property of TEOS. Consequently, production efficiency of a semiconductor manufacturing apparatus based on a CVD method using light can be enhanced.

According to the present invention as described above, a transparent plate is held at a relatively high temperature by a heater to thereby suppress or control the occurrence of fogging in the transparent plate due to deposition action. Therefore, the transmission of light is no longer inhibited and a change in the production rate of a film between respective deposition work operations is less reduced.

As a result, an advantageous effect is obtained in that the quality of the thickness of a film produced for each individual is rendered stable, the time required to perform transparent plate replacing work or the like is shortened and hence production efficiency is enhanced.

Since the peripheral portion of the transparent plate is heated by a heater to thereby make it possible to suppress convection developed in a concave portion between the transparent plate and a top plate and keep uniformity of a distribution of concentration of a material gas on a wafer, the wafer having a film excellent in in-plane thickness uniformity can be obtained.

As a result, an advantageous effect is obtained in that a product yield of each semiconductor produced from one wafer is enhanced, and an improvement in the efficiency of production of the semiconductor by a CVD method using light can be achieved in cooperation with the above effect.

Further aspect of the present invention includes a method of manufacturing a semiconductor by a chemical vapor deposition method using light, comprising the step of: heating a transparent plate for allowing the light to pass therethrough to thereby prevent deposition of a film on the transparent plate.

The other aspect of the present invention includes the transparent plate is heated to allow the transparent plate to have a temperature distribution, thereby controlling the concentration of a material gas in the vicinity of an object to be processed.

The other aspect of the present invention includes the amount of the light transmitted through the transparent plate is controlled by use of a mask member.

The other aspect of the present invention includes the material gas is uniformly supplied to a deposition surface of the object.

The other aspect of the present invention includes the supplied material gas is stirred within the chamber.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A CVD apparatus comprising:
a chamber for storing therein an object to be processed;
a gas supply pipe for supplying a material gas to the chamber;
a light source formed outside of the chamber, the light source providing vacuum ultraviolet light;
a transparent plate provided in the chamber, for allowing the vacuum ultraviolet light to pass therethrough; and
a heater for heating the transparent plate, which is provided directly on the transparent plate.

2. The apparatus according to claim 1, wherein the heater is formed of at least one circular heater.

3. The apparatus according to claim 1, wherein part of the transparent plate is covered with a mask member for controlling a transmitted amount of the vacuum ultraviolet light through said transparent plate.

4. The apparatus according to claims 1, wherein the transparent plate is provided so as to be substantially flush with an internal surface of the chamber.

5. The apparatus according to claims 1, wherein the gas supply pipe has pipe members which extend from an inlet thereof to both sides thereof in a direction to face the object to be processed, and includes a plurality of gas supply holes for supplying the material gas, which are provided on the object sides of the pipe members over the substantially whole area of a deposition surface of the object.

6. The apparatus according to claims 1, wherein the gas supply pipe has a leading end substantially shaped in the form of a triangle and is provided with a slit-shaped gas supply port wider than the diameter of the object at its ends.

7. The apparatus according to claim 4, wherein the gas supply pipe has a leading end substantially shaped in the form of a triangle and includes a slit-shaped gas supply port wider than the diameter of the object at its end, and the transparent plate and the object are disposed so as to oppose each other with a distance slightly longer than a slit width of the slit-shaped gas supply port and an exhaust pipe having a slit-shaped intake port having a size substantially equal to the slit-shaped gas supply port is provided at a position where the exhaust pipe is opposite to the gas supply port.

8. The apparatus according to claims 1, wherein a stirring fan is provided within the chamber.

9. The apparatus according to claim 1, wherein the object is moved during film production.

10. A CVD apparatus comprising:
a chamber for storing therein an object to be processed;
a gas supply pipe for supplying a material gas to the chamber; and
a light source formed outside of the chamber, the light source providing vacuum ultraviolet light light;
a transparent plate provided in the chamber, for allowing the vacuum ultraviolet light to pass therethrough; and
a ring heater provided directly on the transparent plate for heating the transparent plate so that a peripheral portion of the transparent plate is heated while a central portion of the transparent plate keeps its temperature low relative to the peripheral portion.

11. The apparatus according to claim 10, wherein the transparent plate is provided so as to be substantially flush with an internal surface of the chamber.

12. The apparatus according to claim 11, wherein the gas supply pipe has a leading end substantially shaped in the form of a triangle and includes a slit-shaped gas supply port wider than the diameter of the object at its end, and the transparent plate and the object are disposed so as to oppose each other with a distance slightly longer than a slit width of the slit-shaped gas supply port and an exhaust pipe having a slit-shaped intake port having a size substantially equal to the slit-shaped gas supply port is provided at a position where the exhaust pipe is opposite to the gas supply port.

13. The apparatus according to claim 10, wherein part of the transparent plate is covered with a mask member for controlling the transmitted amount of the vacuum ultraviolet light through said transparent plate.

14. The apparatus according to claim 10, wherein the gas supply pipe has pipe members which extend from an inlet thereof to both sides thereof in a direction to face the object to be processed, and includes a plurality of gas supply holes for supplying the material gas, which are provided on the object sides of the pipe members over the substantially whole area of a deposition surface of the object.

15. The apparatus according to claims 10, wherein the gas supply pipe has a leading end substantially shaped in the form of a triangle and is provided with a slit-shaped gas supply port wider than the diameter of the object at its ends.

* * * * *